United States Patent
Gluschenkov et al.

(10) Patent No.: US 9,748,359 B1
(45) Date of Patent: Aug. 29, 2017

(54) VERTICAL TRANSISTOR BOTTOM SPACER FORMATION

(71) Applicant: International Business Machines Corporation, Armonk, NY (US)

(72) Inventors: Oleg Gluschenkov, Tannersville, NY (US); Sanjay C. Mehta, Niskayuna, NY (US); Shogo Mochizuki, Clifton Park, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/336,479

(22) Filed: Oct. 27, 2016

(51) Int. Cl.
| | |
|---|---|
| *H01L 29/78* | (2006.01) |
| *H01L 29/66* | (2006.01) |
| *H01L 29/423* | (2006.01) |
| *H01L 29/786* | (2006.01) |
| *H01L 21/265* | (2006.01) |
| *H01L 21/02* | (2006.01) |

(52) U.S. Cl.
CPC .. *H01L 29/66553* (2013.01); *H01L 21/02255* (2013.01); *H01L 21/26533* (2013.01); *H01L 29/42392* (2013.01); *H01L 29/66666* (2013.01); *H01L 29/78618* (2013.01); *H01L 29/78642* (2013.01)

(58) Field of Classification Search
CPC ................................................ H01L 29/7827
See application file for complete search history.

(56) References Cited

U.S. PATENT DOCUMENTS

| | | | |
|---|---|---|---|
| 7,892,956 B2 | 2/2011 | Deligianni et al. | |
| 9,472,405 B2 | 10/2016 | Nakano | |
| 9,530,866 B1* | 12/2016 | Zhang | ............... H01L 29/66666 |
| 9,570,356 B1* | 2/2017 | Balakrishnan | .... H01L 21/82348 |
| 2005/0199948 A1 | 9/2005 | Lee et al. | |
| 2008/0173937 A1* | 7/2008 | Chung | ............... H01L 29/0657 |
| | | | 257/329 |
| 2011/0012085 A1 | 1/2011 | Deligianni et al. | |
| 2011/0108803 A1 | 5/2011 | Deligianni et al. | |

FOREIGN PATENT DOCUMENTS

JP 6858934 B2 12/2015

* cited by examiner

*Primary Examiner* — Yu-Hsi D Sun
(74) *Attorney, Agent, or Firm* — Scully, Scott, Murphy & Presser, P.C.; Daniel P. Morris, Esq.

(57) ABSTRACT

A silicon layer is formed on a surface of each bottom source/drain region that is present at the footprint of a semiconductor fin. A first set of atoms (nitrogen atoms or carbon atoms) and a second set of atoms (boron atoms and/or carbon atoms) are then ion implanted into the silicon layer and the bottom source/drain regions. An anneal is then performed to convert the silicon layer into a bottom dielectric spacer that is composed of a reaction product of silicon, the first set of atoms and the second set of atoms, while converting each bottom source/drain region into a bottom source/drain structure that includes a first region and a second region. The second region is composed of a doped semiconductor material and at least one of the boron atoms and the carbon atoms; no measurable nitrogen tail and/or oxygen tail is present in the source/drain structures.

20 Claims, 4 Drawing Sheets

VERTICAL TRANSISTOR BOTTOM SPACER FORMATION

BACKGROUND

The present application relates to a semiconductor structure and a method of forming the same. More particularly, the present application relates to a semiconductor structure including a vertical transistor having a bottom dielectric spacer that is present on a bottom source/drain structure, wherein an upper portion of the bottom source/drain structure includes unreacted atoms used in providing the bottom dielectric spacer. The present application also provides a method of forming such a semiconductor structure.

Conventional vertical transistors are devices where the source-drain current flows in a direction normal, i.e., vertical, to the substrate surface. In such devices, a vertical semiconductor pillar defines the channel with the source and drain located at opposing ends of the semiconductor pillar. One advantage of a vertical transistor is that the channel length is not defined by lithography, but by methods such as epitaxy or layer deposition, which enable precise dimensional control. As such, vertical transistors are an attractive option for technology scaling for 5 nm and beyond.

In conventional vertical transistor device architecture, it is difficult to remove the bottom spacer material from the sidewalls of the vertical semiconductor pillar without removing portions of the bottom spacer material that are present above the bottom source/drain region that is formed at the footprint of the vertical semiconductor pillar. Instead, conventional vertical transistors typically have a step coverage of the bottom spacer material along the sidewalls of the vertical semiconductor pillar. Such step coverage may lead to variation in channel length and junction location. As such, there is a need for providing a semiconductor structure including a vertical transistor in which the step coverage of the bottom spacer is minimized thus reducing the variation in channel length and junction location of the vertical transistor.

SUMMARY

A silicon layer is formed on a surface of each bottom source/drain region that is present at the footprint of a semiconductor fin. In one embodiment, nitrogen atoms and at least one of boron atoms and carbon atoms are then ion implanted into the silicon layer and the bottom source/drain regions, and thereafter an anneal is performed. The anneal converts the silicon layer into a bottom dielectric spacer composed of silicon, nitrogen and at least one of boron and carbon, while converting each source/drain region into a source/drain structure. The bottom source/drain structure includes, from bottom to top, a first region and a second region. The second region of the bottom source/drain structure is composed of a doped semiconductor material that further contains the at least one of boron atoms and carbon atoms present therein. In another embodiment, oxygen atoms and carbon atoms, or oxygen atoms and a mixture of carbon atoms and nitrogen atoms are implanted into the Si layer and the bottom source/drain regions and then an anneal is performed. The anneal converts the silicon layer into a bottom dielectric spacer composed of silicon, oxygen and carbon, or silicon, oxygen, carbon and nitrogen, while converting each bottom source/drain region into a bottom source/drain structure that includes, from bottom to top, a first region and a second region. The second region of the bottom source/drain structure includes a doped semiconductor material that further includes carbon atoms present therein. In the present application, step coverage of the bottom dielectric spacer is minimized thus reducing the variation in channel length and junction location of the vertical transistor.

In one aspect of the present application, a semiconductor structure is provided. In one embodiment of the present application, the semiconductor structure includes at least one semiconductor fin extending upward from a surface of a substrate. A bottom source/drain structure is located at the footprint, and on each side, of the at least one semiconductor fin. A bottom dielectric spacer composed of silicon, nitrogen and at least one of boron and carbon is located on each bottom source/drain structure. A functional gate structure is located on each side of the at least one semiconductor fin and above the bottom dielectric spacer. A top dielectric spacer is located on each functional gate structure and contacting a sidewall of a portion of the at least one semiconductor fin. A top source/drain structure extends from each sidewall of an upper portion of the at least one semiconductor fin. In the semiconductor structure of the present application, the bottom source/drain structure comprises, from bottom to top, a first region and a second region, wherein the second region of the bottom source/drain structure is composed of a doped semiconductor material that further contains at least one of boron atoms and carbon atoms present therein.

In another embodiment of the present application, the semiconductor structure includes at least one semiconductor fin extending upward from a surface of a substrate. A bottom source/drain structure is located at the footprint, and on each side, of the at least one semiconductor fin. A bottom dielectric spacer composed of silicon, oxygen, carbon, or silicon, oxygen, carbon and nitrogen is located on each bottom source/drain structure. A functional gate structure is located on each side of the at least one semiconductor fin and above the bottom dielectric spacer. A top dielectric spacer is located on each functional gate structure and contacting a sidewall of a portion of the at least one semiconductor fin. A top source/drain structure extends from each sidewall of an upper portion of the at least one semiconductor fin. In the semiconductor structure of the present application, the bottom source/drain structure comprises, from bottom to top, a first region and a second region, wherein the second region of the bottom source/drain structure is composed of a doped semiconductor material that further contains carbon atoms present therein.

In another aspect of the present application, a method of forming a semiconductor structure is provided. In general terms the method may include forming at least one semiconductor fin extending upward from a surface of a substrate, wherein a bottom source/drain region composed of a doped semiconductor material is located at the footprint, and on each side, of the at least one semiconductor fin. Next, a silicon layer is formed on each bottom source/drain region. A first set of atoms and a second set of atoms are then ion implanted into the silicon layer and the bottom source/drain regions, wherein the first set of atoms comprises nitrogen atoms or oxygen atoms and the set second of atoms comprises at least one of boron atoms and carbon atoms. An anneal is then performed to convert the silicon layer into a bottom dielectric spacer that is composed of a reaction product of silicon, the first set of atoms and the second set or atoms, while converting each bottom source/drain region into a bottom source/drain structure comprising, from bottom to top, a first region and a second region, wherein the second region of the bottom source/drain structure is composed of the doped semiconductor material that further contains at least one of the boron atoms and the carbon atoms present therein.

In one embodiment of the present application, the first set of atoms comprises nitrogen atoms; the second set of atoms comprises the one of carbon atoms and boron atoms mentioned above. In such an embodiment, the anneal converts the silicon layer into a bottom dielectric spacer composed of silicon, nitrogen and at least one of boron and carbon, while converting each bottom source/drain region into a bottom source/drain structure comprising, from bottom to top, a first region and a second region, wherein the second region of the bottom source/drain structure is composed of the doped semiconductor material that further contains boron atoms and carbon atoms present therein. During the anneal, any nitrogen atoms introduced as the first set of atoms into the source/drain regions by the ion implantation process diffuses upward into the silicon layer and are used in providing the bottom dielectric spacer; no measurable nitrogen tail is present in the bottom source/drain structures.

In another embodiment of the present application, the first set of atoms comprises oxygen atoms, and the second set of atoms includes carbon atoms and, optionally, nitrogen atoms. In such an embodiment, the anneal converts the silicon layer into a bottom dielectric spacer composed of silicon, oxygen, carbon, and, optionally, nitrogen, while converting each bottom source/drain region into a bottom source/drain structure comprising, from bottom to top, a first region and a second region, wherein the second region of the bottom source/drain structure is composed of the doped semiconductor material that further contains carbon atoms present therein. During the anneal, any oxygen atoms employed as the first set of atoms and, any nitrogen atoms employed as the second set of atoms that were introduced into the source/drain regions by the ion implantation process diffuse upward into the silicon layer and are used in providing the bottom dielectric spacer; there is no measurable oxygen tail or nitrogen tail present in the bottom dielectric spacer.

The method may further include: forming a functional gate structure located on each side of the at least one semiconductor fin and above the bottom dielectric spacer, forming a top dielectric spacer located on each functional gate structure and contacting a sidewall of a portion of the at least one semiconductor fin, and forming a top source/drain structure extending from each sidewall of an upper portion of the at least one semiconductor fin.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
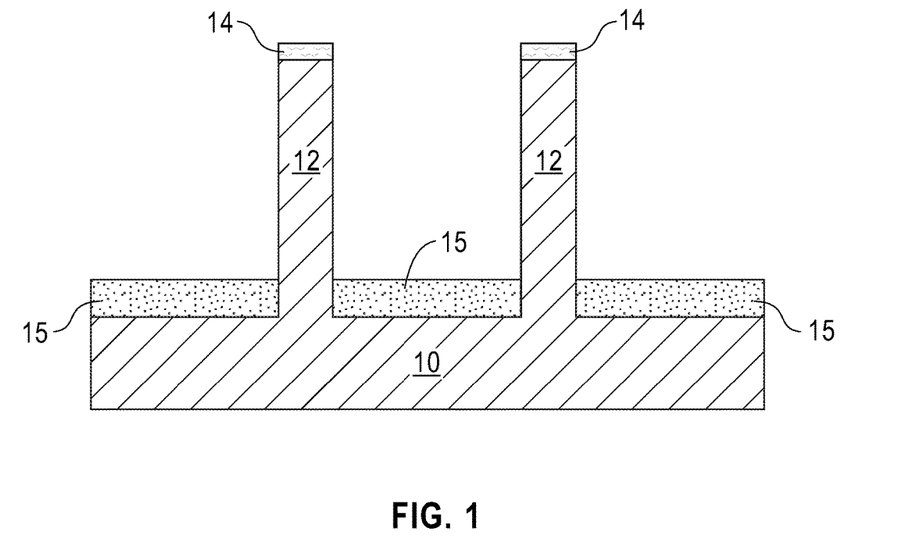
FIG. 1 is a cross sectional view of an exemplary semiconductor structure including a plurality of semiconductor fins located on a surface of a substrate, wherein a bottom source/drain region is present at the footprint, and on each side of, the semiconductor fins.

Referring first to FIG. 1, there is illustrated an exemplary semiconductor structure that can be employed in one embodiment of the present application. The exemplary semiconductor structure of FIG. 1 includes a plurality of semiconductor fins 12 (two of which are shown by way of one example) located on a surface of a substrate 10, wherein a bottom source/drain region 15 is present at the footprint, and on each side, of the semiconductor fins 12. Each semiconductor fin 12 may be capped with a hard mask cap 14. Although the present application describes and illustrates the formation of a plurality of semiconductor fins 12 extending upwards from substrate 10, the present application can be employed when only a single semiconductor fin is formed. The semiconductor fins 12 may also be referred to a vertical semiconductor pillar.

The exemplary semiconductor structure that is shown in FIG. 1 can be formed by first providing a bulk semiconductor substrate (not shown). The term "bulk" when used in conjunction with the term "semiconductor substrate" denotes a substrate that is entirely composed of one or more semiconductor materials having semiconducting properties; no insulator materials or conductive materials are present in a bulk semiconductor substrate.

Examples of semiconductor materials that may provide at least a portion of the bulk semiconductor substrate include silicon (Si), germanium (Ge), silicon germanium alloys (SiGe), silicon carbide (SiC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one example, the bulk semiconductor substrate may be entirely composed of silicon. In another example, the bulk semiconductor substrate may include a multilayered semiconductor material stack of, and in any order, Si and a silicon germanium alloy.

The semiconductor material that provides the bulk semiconductor substrate may be a single crystalline semiconductor material. The semiconductor material that provides the bulk semiconductor substrate may have any of the well known crystal orientations. For example, the crystal orientation of the bulk semiconductor substrate may be {100}, {110}, or {111}. Other crystallographic orientations besides those specifically mentioned can also be used in the present application.

After providing the bulk semiconductor substrate, a layer of hard mask material (not shown) is formed upon the topmost surface of the bulk semiconductor substrate. The layer of hard mask material is a continuous layer that is formed on the entirety of the bulk semiconductor substrate. The layer of hard mask material may be composed of a dielectric oxide, a dielectric nitride, a dielectric oxynitride or a multilayered combination thereof. In one example, the layer of hard mask material may be composed of silicon nitride and/or silicon dioxide. In one embodiment, the layer of hard mask material may be formed by a deposition process such as, for example, chemical vapor deposition (CVD) or plasma enhanced chemical vapor deposition. In another embodiment, the layer of hard mask material may be formed by a thermal growth process such as, for example, thermal oxidation and/or thermal nitridation. In yet another embodiment, the layer of hard mask material may be formed utilizing a combination of a deposition process and thermal growth. The layer of hard mask material that is formed on the bulk semiconductor substrate may have a thickness from 5 nm to 20 nm; although other thicknesses that are lesser than, or greater than, the aforementioned thickness range can also be used as the thickness of the layer of hard mask material.

After providing the bulk semiconductor substrate and the layer of the hard mask material, the layer of hard mask material and the bulk semiconductor substrate are patterned to provide a plurality of fin structures that include a semiconductor fin 12 and a hard mask cap 14 extending upward from substrate 10. Each hard mask cap 14 constitutes a remaining portion of the layer of hard mask material, each semiconductor fin 12 constitutes a remaining upper portion of the bulk semiconductor substrate, and substrate 10 constitutes a remaining portion of the bulk semiconductor substrate. In some embodiments (and as illustrated in the drawings of the present application), no material interface exists between the semiconductor fins 12 and the substrate 10. In other embodiments (not specifically illustrated), a material interface exists between the semiconductor fins 12 and the substrate 10.

In one embodiment, patterning may include lithography and etching. The lithographic process includes forming a photoresist (not shown) atop a material or material stack to be patterned, exposing the photoresist to a desired pattern of radiation and developing the exposed photoresist utilizing a conventional resist developer. The photoresist may be a positive-tone photoresist, a negative-tone photoresist or a hybrid-tone photoresist. The photoresist may be formed utilizing a deposition process such as, for example, spin-on coating. The etching process includes a dry etching process (such as, for example, reactive ion etching, ion beam etching, plasma etching or laser ablation), and/or a wet chemical etching process. Typically, reactive ion etching is used in providing the fin structures (12, 14) shown in FIG. 1 of the present application. In some embodiments, the etching process includes a first pattern transfer step in which the pattern provided to the photoresist is transferred to the layer of hard mask material, the patterned photoresist is then removed by an ashing step, and thereafter, a second pattern transfer step is used to transfer the pattern from the patterned layer of hard mask material (i.e., hard mask caps 14) into the underlying bulk semiconductor substrate.

In another embodiment, patterning may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer (not shown) on each sidewall of each mandrel structure. The spacer can be formed by deposition of a spacer material and then etching the deposited spacer material. The spacer material may comprise any material having an etch selectivity that differs from the mandrel material. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

As used herein, a "semiconductor fin" refers to a semiconductor material that includes a pair of vertical sidewalls that are parallel to each other. As used herein, a surface is "vertical" if there exists a vertical plane from which the surface does not deviate by more than three times the root mean square roughness of the surface. In one embodiment of the present application, each semiconductor fin 12 has a height from 20 nm to 200 nm, and a width from 5 nm to 30 nm. Other heights and/or widths that are lesser than, or greater than, the ranges mentioned herein can also be used in the present application. Each semiconductor fin 12 is spaced apart from its nearest neighboring semiconductor fin 12 by a pitch of from 20 nm to 100 nm. Also, each semiconductor fin 12 is oriented parallel to each other.

At this point of the present application, bottom source/drain regions 15 can be formed at the footprint, and on each side, of the semiconductor fins 12. Each bottom source/drain region 15 includes a semiconductor material and a p-type or n-type dopant; stated in other terms, each bottom source/drain region 15 is composed of a doped semiconductor material. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The semiconductor material that provides each bottom source/drain region 15 may include one of the semiconductor materials mentioned above for the bulk semiconductor substrate. In one embodiment, each bottom source/drain region 15 is composed of a same semiconductor material as substrate 10. In another embodiment, each bottom source/drain region can be composed of a different semiconductor material than substrate 10. Each bottom source/drain region 15 may have a dopant concentration that can be within a range from $2 \times 10^{20}$ atoms/cm$^3$ to $1 \times 10^{21}$ atoms/cm$^3$.

In one embodiment, the bottom source/drain regions 15 can be formed by introducing a p-type or n-type dopant into the substrate 10. In one example, ion implantation be used to introduce the dopant into the substrate 10, followed by an anneal. In such an embodiment, the semiconductor material that provides each bottom source/drain region 15 is the same as the substrate 10.

In another embodiment, the bottom source/drain regions 15 can be formed by epitaxially growing a doped semiconductor material on the substrate 10 or within a trench formed into the substrate 10. In this embodiment, the semiconductor material that provides the source/drain regions 15 may be the same as, or different from, the semiconductor material that provides substrate 10.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. Thus, each bottom source/drain regions 15 has as an epitaxial relationship with the growth surface of substrate 10.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 500° C. to 900° C. Although higher temperature typically results in faster deposition, the faster deposition may result in crystal defects and film cracking. The epitaxial growth can be performed utilizing any well known precursor gas or gas mixture including for example, a silicon containing precursor gas (such as silane) and/or a germanium containing precursor gas (such as a germane). Carrier gases like hydrogen, nitrogen, helium and argon can be used. A dopant can be introduced into the precursor gas during the epitaxial growth process. In other embodiments, the dopant can be introduced after the epitaxial growth process.

Figure 2:
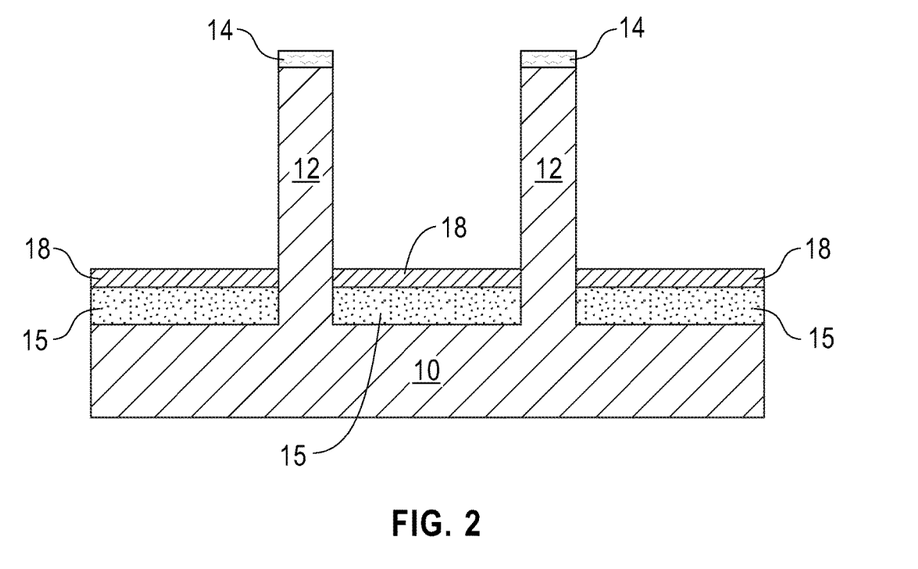
FIG. 2 is a cross sectional view of the exemplary semiconductor structure of FIG. 1 after forming a silicon layer on the topmost surface of each bottom source/drain region.

Referring now to FIG. 2, there is illustrated the exemplary semiconductor structure of FIG. 1 after forming a silicon layer 18 on the topmost surface of each bottom source/drain region 15. The silicon layer 18 has at least one sidewall surface that contacts a lower portion of a sidewall surface of at least one of the semiconductor fins 12. The silicon layer 18 has a height that is less than a height of each semiconductor fin 12, and is confined to be present at a bottom portion of each semiconductor fin 12. The height of each silicon layer 18 that is formed can be from 2 nm to 5 nm. The silicon layer 18 is non-doped.

The silicon layer 18 can be formed utilizing an epitaxial growth process as defined above in which a silicon containing precursor gas is employed. Thus, the silicon layer 18 has an epitaxial relationship with the bottom source/drain regions 15. After epitaxial growth of the silicon layer 18, the silicon layer 18 may be recessed to provide the structure shown in FIG. 2.

Figure 3:
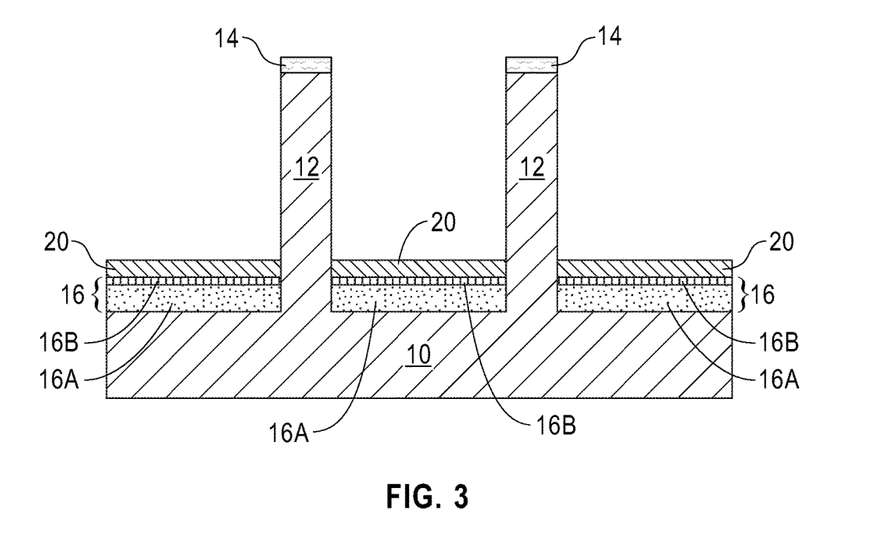
FIG. 3 is a cross sectional view of the exemplary semiconductor structure of FIG. 2 after converting the silicon layer into a bottom dielectric spacer, and each bottom source/drain region into a bottom source/drain structure.

Referring now to FIG. 3, there is illustrated the exemplary semiconductor structure of FIG. 2 after converting the silicon layer 18 into a bottom dielectric spacer 20, and each bottom source/drain region 15 into a bottom source/drain structure 16. The conversion may include introducing a mixture of atoms into the silicon layer 18 and the bottom source/drain regions 15; the atoms are only introduced into an upper portion of each bottom source/drain region. The mixture of atoms, includes a first set atoms and a second set of atoms. The first set of atoms diffuse upward into the silicon layer 18 during a subsequent anneal. In one embodiment, the first set of atoms includes nitrogen atoms. In another embodiment, the first set of atoms includes oxygen atoms. In embodiments in which the first set of atoms includes nitrogen atoms, the second set of atoms may includes at least one of boron atoms and carbon atoms (i.e., boron atoms, carbon atoms, or a mixture of carbon atoms and boron atoms). In embodiments in which the first set of atoms includes oxygen atoms, then the second set of atoms includes carbon atoms or a mixture of carbon atoms and nitrogen atoms. Upon subsequent annealing, the first and second sets of atoms react with silicon in the silicon layer 18 forming a bottom dielectric spacer 20 that is composed of silicon and the various atoms that comprise the first and second set of atoms. Also, and during the anneal, any nitrogen and/or oxygen atoms that are introduced into the bottom source/drain regions 15 diffuse upward into the Si layer 18 and these diffuse atoms can participate in the formation of the bottom dielectric spacer 20; no diffusion of carbon atoms, and/or boron atoms occurs. In one embodiment, the bottom dielectric spacer 20 may be composed of silicon, nitrogen and at least one of boron and carbon. In such an embodiment, the bottom dielectric spacer 20 may be composed of silicon, boron, carbon and nitrogen, of silicon, boron and nitrogen, or of silicon, carbon and nitrogen. In another embodiment, the bottom dielectric spacer 20 may be composed of silicon, oxygen and carbon, or silicon, oxygen, carbon and nitrogen.

The introducing may include ion implantation of a plasma that contains the first and second sets of atoms. The energy of the ion implantation may range from 50 eV to 200 eV (eV stands for electron volts). Other energies are possible as long as the peak of the implantation occurs within the silicon layer 18; a tail portion of the implant also occurs in an upper portion of the source/drain regions 15. The ion implantation is typically performed at a temperature from 0° C. to 500° C. The first and second set of atoms can be introduced utilizing an ion dose from $5 \times 10^{15}$ atoms/cm$^2$ to $1 \times 10^{17}$ atoms/cm$^2$. At such a dosage, the atoms can be present in the bottom dielectric spacer 20 in an amount from $1 \times 10^{21}$ atoms/cm$^3$ to $7 \times 10^{22}$ atoms/cm$^3$.

In some embodiments of the present application (and as is shown), the anneal can be performed at this point of the present application. A single anneal or multiple anneals may be performed. The anneal may be performed in an inert ambient and at a temperature from 400° C. to 600° C. Higher anneal temperature are possible. For example, and when a laser anneal is employed, the anneal temperature may be from 800° C. to 1300° C. In some embodiment, a first anneal at a first temperature (i.e., 400° C. to 600° C.) and a second anneal at a second temperature that is higher than the first temperature (i.e., 800° C. to 1300° C.) may be performed. The duration of the anneal may vary depending on the type of anneal employed. The anneal may include a furnace anneal, a rapid thermal anneal, a laser anneal or any other type of anneal. During the annealing, and as mentioned above, at least the first set of atoms (i.e., nitrogen or oxygen atoms) and the second set of atoms (i.e., at least one of boron and carbon, or carbon and, optionally, nitrogen) react with silicon in the silicon layer 18 forming the bottom dielectric spacer 20. Also and during the anneal, nitrogen atoms and/or oxygen atoms are diffused out of the source/drain regions 15 converting the source/drain regions 15 into a bottom source/drain structure 16 that contains, from bottom to top, a first region 16A and a second region 16B. The bottom source/drain region 16 includes the same semiconductor material, same dopant (n-type or p-type) and same dopant concentration as the bottom source/drain region 15. The first region 16A is composed of doped semiconductor material without any of the above mentioned atoms (thus the first region 16A consists of the doped semiconductor material only), while the second region 16B is composed of a doped semiconductor material that contains either atoms of at least one of boron and carbon (when nitrogen is used as the first set of atoms) or carbon (when oxygen atoms are used as the first set of atoms). The amount of atoms that are present in the second region 16B of the bottom source/drain structure 16 can be from $1 \times 10^{19}$ atoms/cm$^3$ to $5 \times 10^{20}$ atoms/cm$^3$; it should be noted that the atoms that are present in the second region 16B are additional atoms that are introduced during the ion implantation process not during the formation of the source/drain regions 15. No measurable tail of nitrogen atoms and/or oxygen atoms is present in the bottom source/drain structure 16. The second region 16B of the bottom source/drain structure 16 may have a thickness of from 1 nm to 4 nm. A topmost surface of the second region 16B of the bottom source/drain structure 16 is in direct physical contact with the bottommost surface of the bottom dielectric spacer 20.

In some embodiments, the anneal mentioned above can be delayed and performed later on in the process. For example, the anneal may be performed after forming the functional gate structures and during contact formation.

Figure 4:
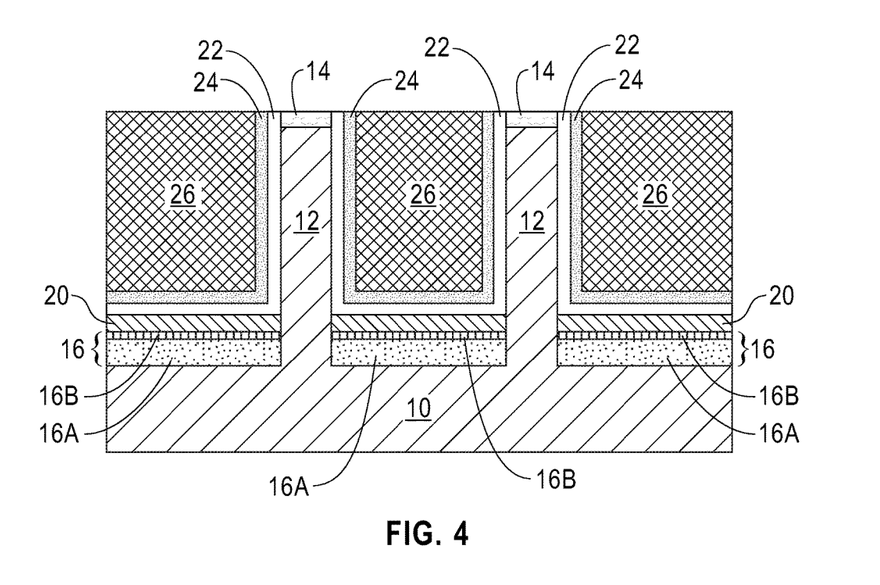
FIG. 4 is a cross sectional view of the exemplary semiconductor structure of FIG. 3 after formation of a functional gate structure on each side of the semiconductor fins.

Referring now to FIG. 4, there is illustrated the exemplary semiconductor structure of FIG. 3 after formation of a functional gate structure (22, 24, 26) on each side of the semiconductor fins 12. Each functional gate structure (22, 24, 26) is formed above the bottom dielectric spacer 20. At this point of the present application, each functional gate structure (22, 24, 26) has a topmost surface that is coplanar with a topmost surface of the hard mask cap 14. As is shown, the gate dielectric liner 22 has one sidewall directly contacting a sidewall of one of the semiconductor fins 12 and a bottommost surface that is located on the bottom dielectric spacer 20.

By "functional gate structure" it is meant a permanent gate structure used to control output current (i.e., flow of carriers in the channel) of a semiconducting device through electrical or magnetic fields. Each functional gate structure may include a gate dielectric liner 22, a gate conductor liner 24, and a gate conductor structure 26. In some embodiments, the gate conductor liner 24 may be omitted. The gate dielectric liner 22 and the gate conductor liner 24 may be U-shaped. By "U-shaped" it is meant a material that has a horizontal portion and two vertical portions extending upward from each end of the horizontal portion.

Each gate dielectric liner 22 is composed of a gate dielectric material such as, for example, a dielectric oxide, nitride, and/or oxynitride. In one example, the gate dielectric material that provides each gate dielectric liner 22 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric material of each gate dielectric liner 22. The gate dielectric material that provides each gate dielectric liner 22 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material that can provide each gate dielectric liner 22 can have a thickness in a range from 1 nm to 10 nm. Other thicknesses that are lesser than, or greater than, the aforementioned thickness range can also be employed for the gate dielectric material of each gate dielectric liner 22.

Each gate conductor liner 24, which is contact with an exposed surface of a respective gate dielectric liner 22, can include a gate conductor material. The gate conductor material used in providing each gate conductor liner 24 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof.

Each gate conductor liner 24 may be composed of nFET gate metal or a pFET gate metal. The gate conductor material used in providing each gate conductor liner 24 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, gate conductor liner 24 can have a thickness from 20 nm to 100 nm. Other thicknesses that are lesser than, or greater than, the aforementioned thickness range can also be employed for the gate conductor liner 24.

Each gate conductor structure 26 comprises one of the conductor materials mentioned above for the gate conductor liner 24. Typically, but not necessarily always, each gate conductor structure 26 comprises a different gate conductor material than the gate conductor liner 24. For example, each gate conductor liner 24 may include an nFET gate metal or a pFET gate metal and the gate conductor structure 26 may comprise polysilicon or an elemental metal such as tungsten. Each gate conductor structure 26 can be formed by first depositing a gate conductor material utilizing one of the deposition processes mentioned above in forming gate conductor liner 24.

After providing each material layer of the functional gate structure, a planarization process such as, for example, chemical mechanical polishing (CMP), may be employed to provide the planar structure shown in FIG. 4.

Figure 5:
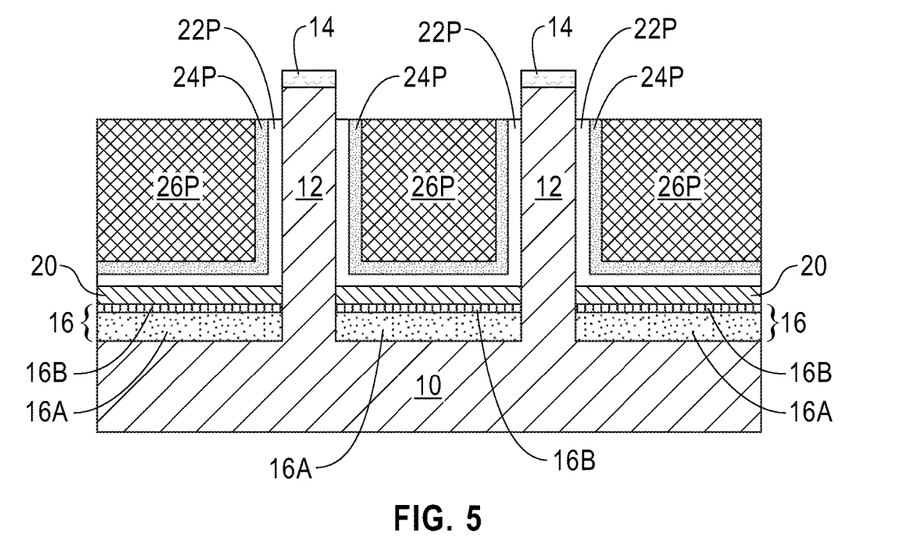
FIG. 5 is a cross sectional view of the exemplary semiconductor structure of FIG. 4 after recessing an upper portion of each functional gate structure.

Referring now to FIG. 5, there is illustrated the exemplary semiconductor structure of FIG. 4 after recessing an upper portion of each functional gate structure (22, 24, 26). The recessing may be performed utilizing a recess etch. The recess etch provides a functional gate structure that now includes a remaining portion of the gate dielectric liner 22, a remaining portion of the gate conductor liner 24 (if present), and a remaining portion of the gate conductor structure 26. The remaining portion of the gate dielectric liner 22 may be referred to herein as a gate dielectric liner portion 22P, the remaining portion of the gate conductor liner 24, if present, may be referred to herein as a gate conductor liner portion 24P, and the remaining portion of the gate conductor structure 26 may be referred to herein as a gate conductor portion 26P.

Figure 6:
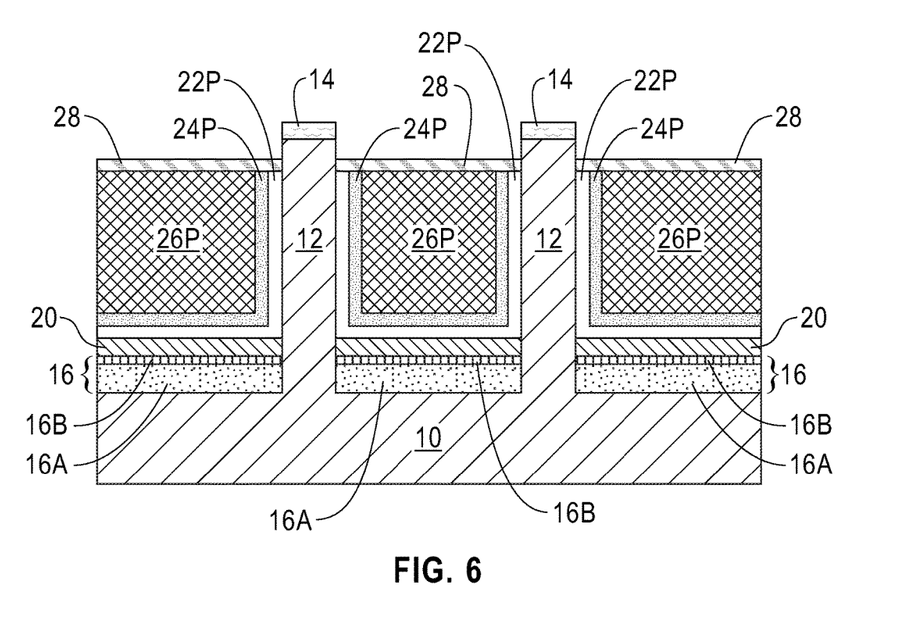
FIG. 6 is a cross sectional view of the exemplary semiconductor structure of FIG. 5 after forming a top dielectric spacer.

Referring now to FIG. 6, there is illustrated the exemplary semiconductor structure of FIG. 5 after forming a top dielectric spacer 28. Top dielectric spacer 28 may be formed by deposition of a spacer dielectric material. A recess etch may follow the deposition of the spacer dielectric material. The spacer dielectric material that provides the top dielectric spacer 28 may include for example, silicon dioxide, silicon nitride and/or silicon oxynitride. The top dielectric spacer 28 has a height that does not exceed the height of the semiconductor fin 12. Hence, the topmost surface of the top dielectric spacer 28 is located beneath a topmost surface of the semiconductor fin 12.

Figure 7:
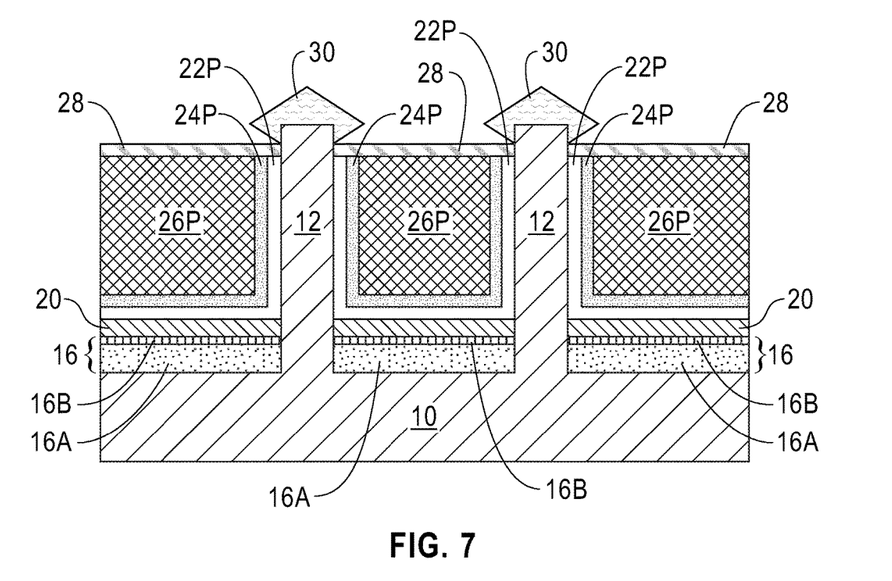
FIG. 7 is a cross sectional view of the exemplary semiconductor structure of FIG. 6 after forming a top source/drain structure from exposed surfaces of an upper portion of each semiconductor fin in accordance with one embodiment of the present application.

Referring now to FIG. 7, there is illustrated the exemplary semiconductor structure of FIG. 6 after forming top source/drain structures 30. Notably, FIG. 7 illustrates the exemplary semiconductor structure of FIG. 6 after forming a top source/drain structure 30 from exposed surfaces (top and sidewall) of an upper portion of each semiconductor fin 12 in accordance with one embodiment of the present application. In FIG. 7, each hard mask cap 14 is removed from atop each semiconductor fin 12 to expose a topmost surface of the semiconductor fin 12. The removal of each hard mask cap 14 may be performed utilizing a planarization process.

The top source/drain structures 30 can be formed utilizing an epitaxial growth (or deposition) as defined above. Each top source/drain structure 30 includes a semiconductor material and a dopant (n-type or p-type) as defined above. The dopant, which is of the same conductivity type as the bottom source/drain region 15 and the bottom source/drain structure 16, can be added during the epitaxial growth of the semiconductor material that provides each top source/drain structure 30 or after epitaxially depositing an intrinsic semiconductor material utilizing a gas phase doping process. The dopant can be present in each top source/drain structure 30 in a range as mentioned above for the bottom source/drain region 15 and the bottom source/drain structure 16. The semiconductor material that provides the each top source/drain structure 30 may be the same as, or different from, the semiconductor material that provides the semiconductor fin 12.

In some embodiments, and as shown, each top source/drain structure 30 may have faceted surfaces, i.e., non-planar surfaces. Such an embodiment is depicted in FIG. 7. In some embodiments and as also shown in FIG. 7, each top source/drain structure 30 is triangular in shape, wherein the base of the triangle directly contacts one of the sidewalls of the upper portion of the semiconductor fin 12 and a tip of the triangle extends outward from the one sidewall of the upper portion of the semiconductor fin 12. In some embodiments, and as shown in FIG. 7, each triangle may merge above the topmost surface of the semiconductor fin 12. In such an instance, the top source/drain structure 30 has a diamond shape.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   at least one semiconductor fin extending upward from a surface of a substrate;
   a bottom source/drain structure located at the footprint, and on each side, of the at least one semiconductor fin;
   a bottom dielectric spacer composed of silicon, nitrogen and at least one of boron and carbon located on each bottom source/drain structure;
   a functional gate structure located on each side of the at least one semiconductor fin and above the bottom dielectric spacer;
   a top dielectric spacer located on each functional gate structure and contacting a sidewall of a portion of the at least one semiconductor fin; and
   a top source/drain structure extending from each sidewall of an upper portion of the at least one semiconductor fin, wherein the bottom source/drain structure comprises, from bottom to top, a first region and a second region, wherein the second region of the bottom source/drain structure is composed of a doped semiconductor material that further contains at least one of boron atoms and carbon atoms present therein.

2. The semiconductor structure of claim 1, wherein each bottom source/drain structure contains no measurable tail of nitrogen atoms.

3. The semiconductor structure of claim 1, wherein the bottom dielectric spacer is composed of silicon, boron, carbon and nitrogen, or silicon, boron and nitrogen, or silicon, carbon, and nitrogen.

4. The semiconductor structure of claim 1, wherein the content of the at least one of boron atoms and carbon atoms present in the doped semiconductor material that provides the second region of each bottom source/drain structure is from $1\times10^{21}$ atoms/cm$^3$ to $7\times10^{22}$ atoms/cm$^3$.

5. The semiconductor structure of claim 1, wherein a bottommost surface of the bottom dielectric spacer is in direct physical contact with the second region of the bottom source/drain structure.

6. A semiconductor structure comprising:
 at least one semiconductor fin extending upward from a surface of a substrate;
 a bottom source/drain structure located at the footprint, and on each side, of the at least one semiconductor fin;
 a bottom dielectric spacer composed of silicon, oxygen and carbon located on each bottom source/drain structure;
 a functional gate structure located on each side of the at least one semiconductor fin and above the bottom dielectric spacer;
 a top dielectric spacer located on each functional gate structure and contacting a sidewall of a portion of the at least one semiconductor fin; and
 a top source/drain structure extending from each sidewall of an upper portion of the at least one semiconductor fin, wherein the bottom source/drain structure comprises, from bottom to top, a first region and a second region, wherein the second region of the bottom source/drain structure is composed of a doped semiconductor material that further contains carbon atoms present therein.

7. The semiconductor structure of claim 6, wherein each bottom source/drain structure contains no measurable tail of oxygen atoms.

8. The semiconductor structure of claim 7, wherein the bottom dielectric spacer is further composed of nitrogen, and wherein each bottom source/drain structure contains no measureable tail of nitrogen atoms.

9. The semiconductor structure of claim 6, wherein the content of the carbon atoms present in the doped semiconductor material that provides the second region of each bottom source/drain structure is from $1\times10^{21}$ atoms/cm$^3$ to $7\times10^{22}$ atoms/cm$^3$.

10. The semiconductor structure of claim 6, wherein a bottommost surface of the bottom dielectric spacer is in direct physical contact with the second region of the bottom source/drain structure.

11. A method of forming a semiconductor structure, the method comprising:
 forming at least one semiconductor fin extending upward from a surface of a substrate, wherein a bottom source/drain region composed of a doped semiconductor material is located at the footprint, and on each side, of the at least one semiconductor fin;
 forming a silicon layer on each bottom source/drain region;
 ion implanting a first set of atoms and a second set of atoms into the silicon layer and the bottom source/drain regions, wherein the first set of atoms comprises nitrogen atoms or oxygen atoms and the set second of atoms comprises at least one of boron atoms and carbon atoms; and
 annealing to convert the silicon layer into a bottom dielectric spacer that is composed of a reaction product of silicon, the first set of atoms and the second set or atoms, while converting each bottom source/drain region into a bottom source/drain structure comprising, from bottom to top, a first region and a second region, wherein the second region of the bottom source/drain structure is composed of the doped semiconductor material that further contains at least one of the boron atoms and the carbon atoms present therein.

12. The method of claim 11, wherein the first set of atoms comprises the nitrogen atoms, and the second set of atoms comprises at least the one of boron atoms and carbon atoms, and the bottom dielectric spacer comprises silicon, nitrogen and at least one of carbon and boron.

13. The method of claim 11, wherein the first set of atoms comprises the oxygen atoms, and the second set of atoms comprises the carbon atoms or the carbon atoms and nitrogen atoms, and the bottom dielectric spacer comprises silicon, oxygen, carbon or silicon, oxygen, carbon, and nitrogen.

14. The method of claim 11, wherein the annealing is performed in an inert ambient and at a temperature from 400° C. to 600° C. and/or from 800° C. to 1200° C.

15. The method of claim 11, ion implanting is performed at an energy from 50 eV to 200 eV.

16. The method of claim 11, wherein the content of the at least one of carbon atoms and boron atoms present in the doped semiconductor material that provides the second region of each bottom source/drain structure is from $1\times10^{21}$ atoms/cm$^3$ to $7\times10^{22}$ atoms/cm$^3$.

17. The method of claim 11, wherein each bottom source/drain structure contains no measurable tail of nitrogen atoms and/or oxygen atoms.

18. The method of claim 11, further comprising:
 forming a functional gate structure located on each side of the at least one semiconductor fin and above the bottom dielectric spacer;
 forming a top dielectric spacer located on each functional gate structure and contacting a sidewall of a portion of the at least one semiconductor fin; and
 forming a top source/drain structure extending from each sidewall of an upper portion of the at least one semiconductor fin.

19. The method of claim 18, wherein the forming the top source/drain structure comprises an epitaxial growth process.

20. The method of claim 18, wherein each top source/drain structure has a faceted surface.

* * * * *